(12) United States Patent
Huang et al.

(10) Patent No.: US 8,330,198 B2
(45) Date of Patent: Dec. 11, 2012

(54) DEVICE FOR PREVENTING CURRENT-LEAKAGE

(75) Inventors: Shin Bin Huang, Hsinchu County (TW); Chung-Lin Huang, Taoyuan County (TW); Ching-Nan Hsiao, Kaohsiung County (TW); Tzung Han Lee, Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 264 days.

(21) Appl. No.: 12/758,252

(22) Filed: Apr. 12, 2010

(65) Prior Publication Data
US 2011/0127574 A1 Jun. 2, 2011

(30) Foreign Application Priority Data

Nov. 30, 2009 (TW) .................................. 98140797

(51) Int. Cl.
*H01L 27/108* (2006.01)
(52) U.S. Cl. ................... 257/297; 257/119; 257/E29.28; 257/110; 257/E21.361

(58) Field of Classification Search .................. None
See application file for complete search history.

(56) References Cited

U.S. PATENT DOCUMENTS
2006/0043411 A1* 3/2006 Bhattacharyya .............. 257/138

\* cited by examiner

*Primary Examiner* — Fei Fei Yeung Lopez
(74) *Attorney, Agent, or Firm* — Rosenberg, Klein & Lee

(57) ABSTRACT

A device for preventing current-leakage is located between a transistor and a capacitor of a memory cell. The two terminals of the device for preventing current-leakage are respectively connected with a slave terminal of the transistor and an electric pole of the capacitor. The device for preventing current-leakage has at least two p-n junctions. The device for preventing current-leakage is a lateral silicon controlled rectifier, a diode for alternating current, or a silicon controlled rectifier. By utilizing the driving characteristic of the device for preventing current-leakage, electric charge stored in the capacitor hardly passes through the device for preventing current-leakage when the transistor is turned off to improve the current-leakage problem.

10 Claims, 9 Drawing Sheets

DEVICE FOR PREVENTING CURRENT-LEAKAGE

BACKGROUND OF THE INVENTION

1. Field of the Invention

The present invention relates to a device for preventing current-leakage. In particular, the present invention relates to a device for preventing current-leakage that is used for a memory cell.

2. Description of Related Art

A dynamic random access memory usually has a current-leakage problem. Therefore, electric charge needs to be charged in the capacitor within a fixed period to make the capacitor be kept in the pre-determined status (0 or 1).

In order to improve the current-leakage problem of the capacitor to reduce the times of charging the electric charge, some methods are developed, such as increasing the gate channel length, increasing the surface area of the capacitor for storing current, increasing the dielectric constant of the dielectric layer, etc. However, such methods are not efficient enough.

SUMMARY OF THE INVENTION

One particular aspect of the present invention is to provide a device for preventing current-leakage that improves the current-leakage problem of capacitors and reduces the times of charging the electric charge.

The device for preventing current-leakage is located between a transistor and a capacitor of a memory cell. The device for preventing current-leakage is a lateral silicon controlled rectifier, a diode for alternating current, or a silicon controlled rectifier, and the two terminals are respectively connected with the slave terminal of the transistor and an electric pole (i.e. terminal, or electrode) of the capacitor.

The present invention has the following characteristics. The device for preventing current-leakage has at least two p-n junctions so that the electric charge stored in the capacitor hardly flows through the device for preventing current-leakage, when the transistor is turned off. Therefore, the current-leakage problem of capacitors can be improved and the times of charging the electric charge (i.e. refresh) are reduced.

For further understanding of the present invention, reference is made to the following detailed description illustrating the embodiments and examples of the present invention. The description is for illustrative purpose only and is not intended to limit the scope of the claim.

DETAILED DESCRIPTION OF THE PREFERRED EMBODIMENTS

Figure 1:
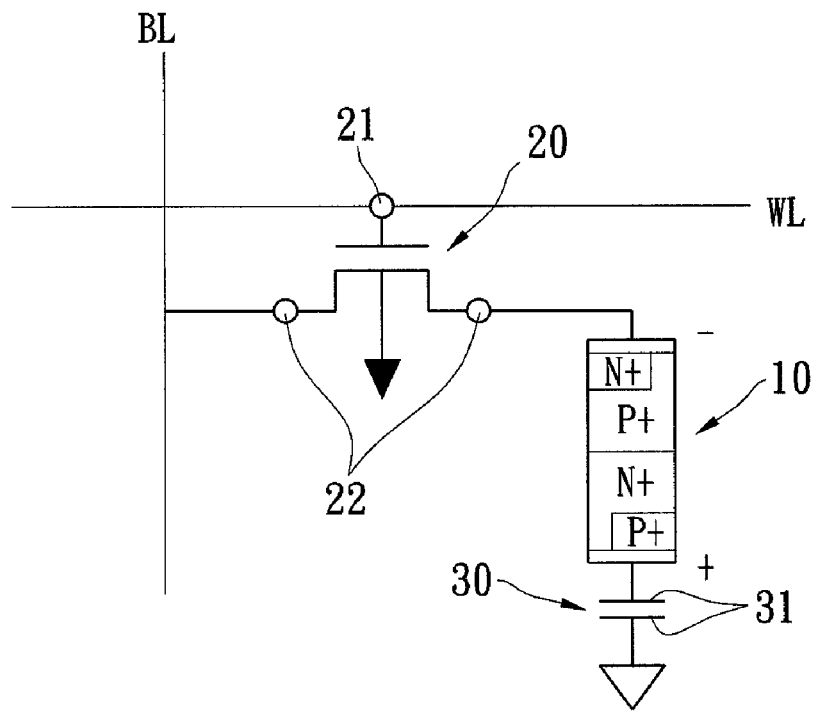
FIG. 1 is a circuit diagram of the first embodiment of the present invention.
Figure 5:
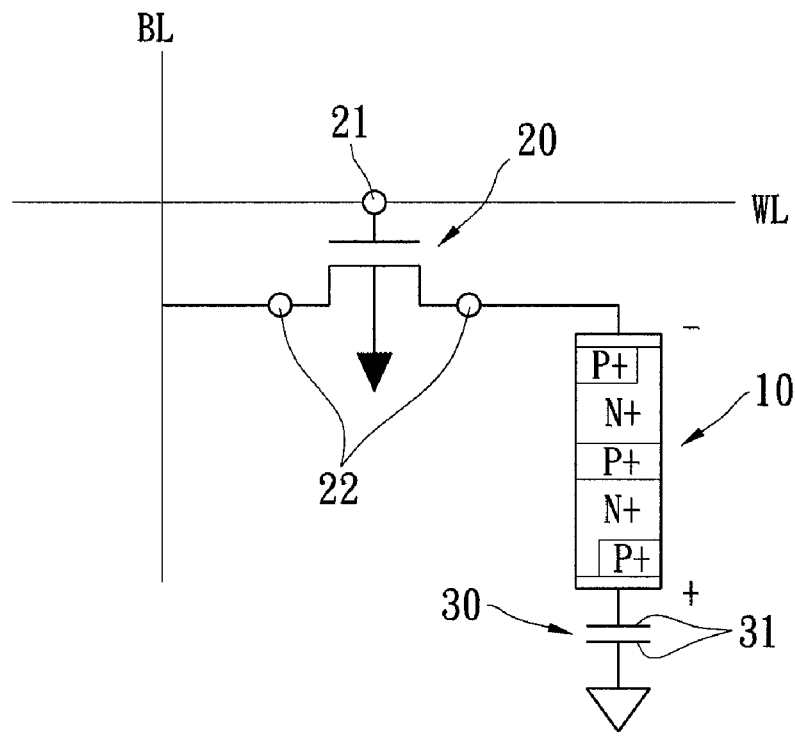
FIG. 5 is a circuit diagram of the second embodiment of the present invention
Figure 8:
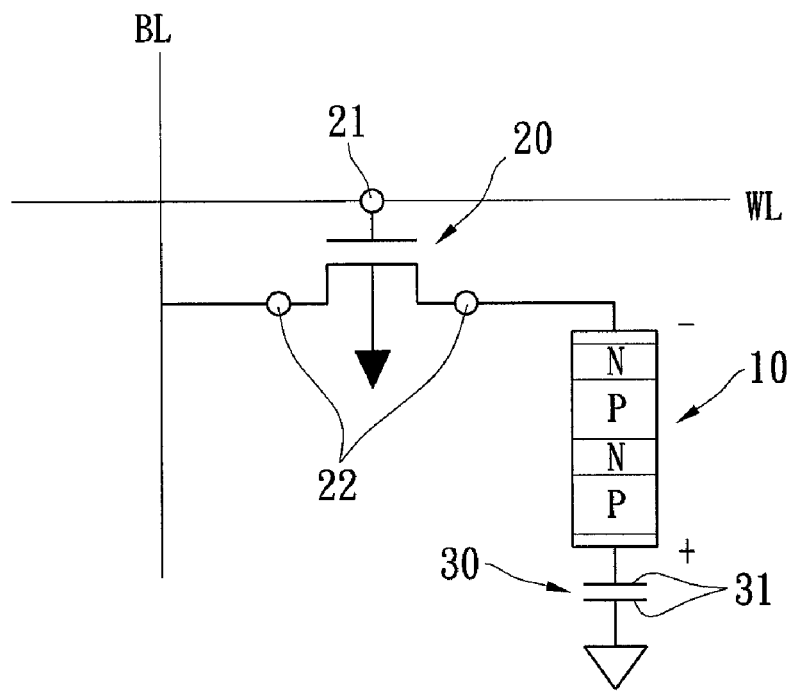
FIG. 8 is a circuit diagram of the third embodiment of the present invention

Reference is made to FIGS. 1, 5 and 8, which show three embodiments of the device for preventing current-leakage 10 of the present invention. In order to clearly illustrate the present invention, the device for preventing current-leakage 10 is called as a device 10. Each device 10 has at least two p-n junctions so that the device 10 has a specific voltage-to-current characteristic. The device 10 is located in a memory cell. The memory cell is a dynamic random access memory. The device 10 is located between a transistor 20 and a capacitor 30 of the memory cell.

The transistor 20 can be a NMOS transistor. The transistor 20 has a master terminal 21 and two slave terminals 22. The master terminal 21 is a gate. The salve terminal 22 is a source or a drain. The gate is connected with a word line WL. The source is connected with a bit line BL. The capacitor 30 can be a stacked capacitor or a trench capacitor.

The details of the transistor 20 and the capacitor 30 are well known for people skilled in this field and are not illustrated clearly. The device 10 is not limited to be applied to a specific transistor 20 and capacitor 30.

Reference is made to FIG. 1, which shows the first embodiment of the device 10 of the present invention. The device 10 is a lateral silicon controlled rectifier (lateral SCR). The two terminals of the device 10 are respectively connected with a slave terminal (drain) 22 of the transistor 20 and an electric pole 31 of the capacitor 30. When the capacitor is a stacked capacitor, one terminal of the device 10 is connected with a lower electric pole of the capacitor 30.

Figure 2:
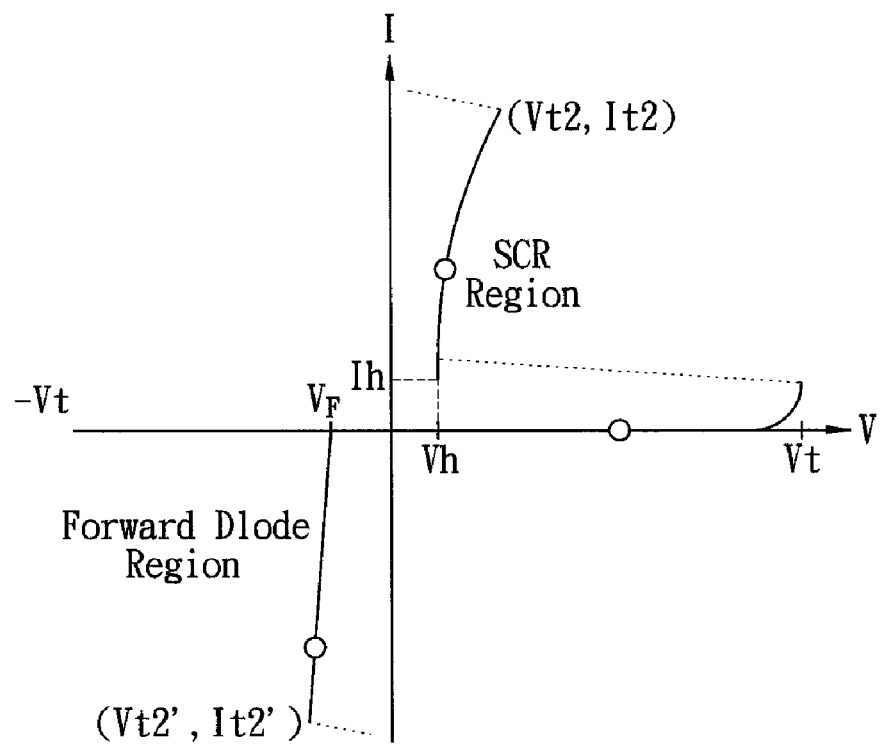
FIG. 2 is a characteristic diagram of the voltage-to-current of the first embodiment of the present invention.

Reference is made to FIG. 2. The usage way of the device 10 is illustrated. After the device 10 is added to the memory cell, how to store and read data from the capacitor 30 and how to reduce the current-leakage of the capacitor 30 by the device 10 are illustrated.

FIG. 2 is a characteristic diagram of the voltage-to-current of the lateral silicon controlled rectifier. When the voltage of the two terminals of the lateral silicon controlled rectifier is negative, electric charge can easily flow through the lateral silicon controlled rectifier. The electric charge moves to the positive terminal from the negative terminal of the lateral silicon controlled rectifier. When the voltage of the two terminals of the lateral silicon controlled rectifier is positive, and is larger than a threshold voltage Vt, the electric charge also can easily flow through the lateral silicon controlled rectifier. The electric charge moves to the negative terminal from the positive terminal of the lateral silicon controlled rectifier.

When the capacitor 30 is stored with data (such as a logic status 1), the bit line BL needs a positive voltage, and the word line WL also needs a positive voltage. Therefore, both the source and the gate of the transistor 20 are positive voltage. The transistor 20 is turned on, and electric charge flows into the drain from the source. Furthermore, because the voltage of the two terminals of the lateral silicon controlled rectifier is negative, electric charge can pass trough the lateral silicon controlled rectifier and flow into the capacitor 30.

Next, the voltage of the word line WL becomes zero, and the transistor 20 is turned off. The electric charge stored in the capacitor 30 is in a un-balance status, and wants to flow out of the capacitor 30. This is the current-leakage symptom. However, because the voltage of the two terminals of the lateral silicon controlled rectifier is not over the threshold voltage, the electric charge of the capacitor 30 hardly passes through the lateral silicon controlled rectifier (from the positive terminal to the negative terminal of the lateral silicon controlled rectifier). Therefore, the electric charge of the capacitor 30 hardly leakages from the transistor 20 to reduce the current-leakage of the capacitor 30. The logic status 1 can be kept for a longer time.

When the data is read from the capacitor 30, the bit line BL needs a negative voltage, the absolute value of the negative voltage is larger than the absolute value of the threshold voltage, and the word line WL needs a positive voltage. Therefore, the source of the transistor 20 is negative voltage, the gate of the transistor 20 is positive voltage, and the transistor 20 is turned on. Because the voltage of the two terminals of the lateral silicon controlled rectifier is a positive voltage and is larger than the threshold voltage, the electric charge of the capacitor 30 can pass through the lateral silicon controlled rectifier and flow to the source. Thereby, the status of the capacitor 30 is read.

The above description is the effect of the device 10 and how to be used. Next, the structure and the manufacturing process of the device 10 are illustrated.

Figure 3:
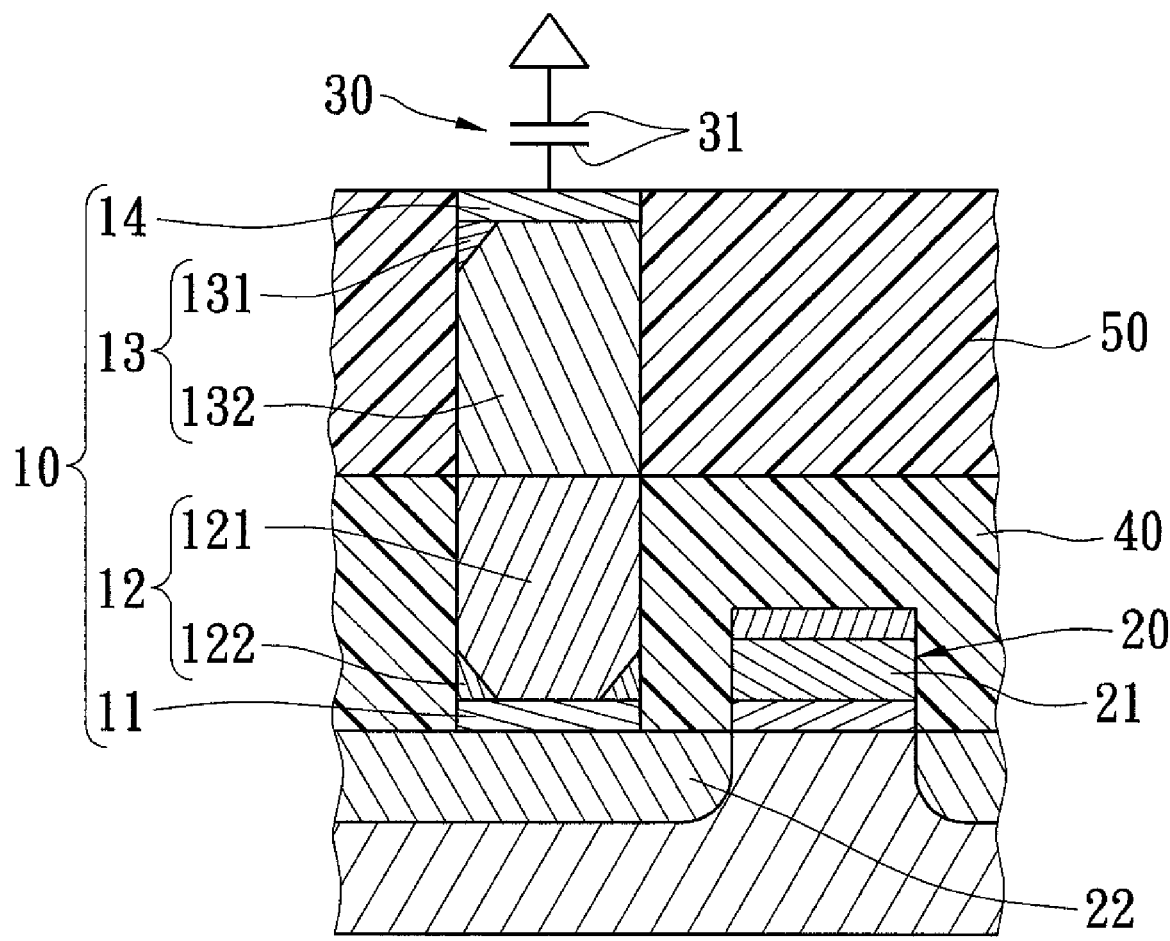
FIG. 3 is a schematic diagram of structure of the first embodiment of the present invention.

Reference is made to FIG. 3. The device 10 is stacked by a first conducting layer 11, a first structure 12, a second structure 13, and a second conducting layer 14 orderly.

The first conducting layer 11 is connected with the slave terminal (the drain) 22 of the transistor 20. The first structure 12 has a first P-typed region 121 and a first N-typed region 122. The lower side of the first P-typed region 121 and the lower side of the first N-typed region 122 contacts the first conducting layer 11, and the thickness of the first P-typed region 121 is larger than the thickness of the first N-typed region 122.

The second structure 13 has a second P-typed region 131 and a second N-typed region 132. The lower side of the second N-typed region 132 contacts the upper side of the first P-typed region 121. There is a gap between the lower side of the second P-typed region 131 and the upper side of the first P-typed region 121. Both do not contact. The lower side of the second conducting layer 14 contacts the upper side of the second P-typed region 131 and the upper side of the second N-typed region 132. The upper side of the second conducting layer 14 is connected with the electric pole 31 of the capacitor 30.

After the transistor 20 of the memory cell is manufactured, the device 10 can be manufactured. The manufacturing process is described as below.

Figure 4A:
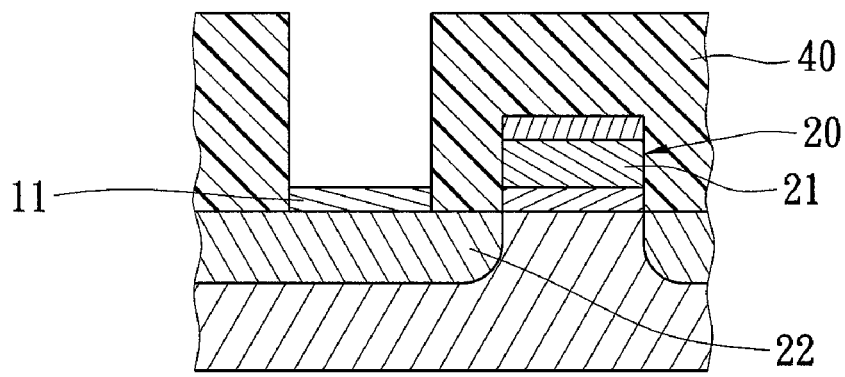
FIG. 4A~4G is a flow chart of the manufacturing process of the first embodiment of the present invention n.

Reference is made to FIG. 4A. The master terminal 21 of the transistor 20 is wrapped by an insulating material 40. Above the slave terminal 22, there is an opening. The material of the first conducting layer 11 can be a conducting metal, such as Ti, and is stacked on the slave terminal 22 by a depositing method. Next, it is annealed to Ti silicide.

Figure 4B:
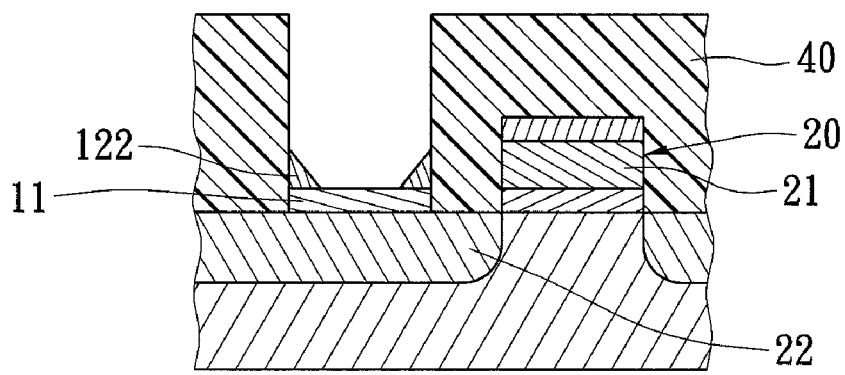

Reference is made to FIG. 4B. Next, a layer of poly silicon is deposited. The center of the poly silicon is removed by etching process. Therefore, the slave terminal 22 of the transistor 20 is not fully covered by poly silicon. N-typed impurity is implanted into the poly silicon so that the poly silicon becomes N-typed poly silicon to form the first N-typed region 122.

Figure 4C:
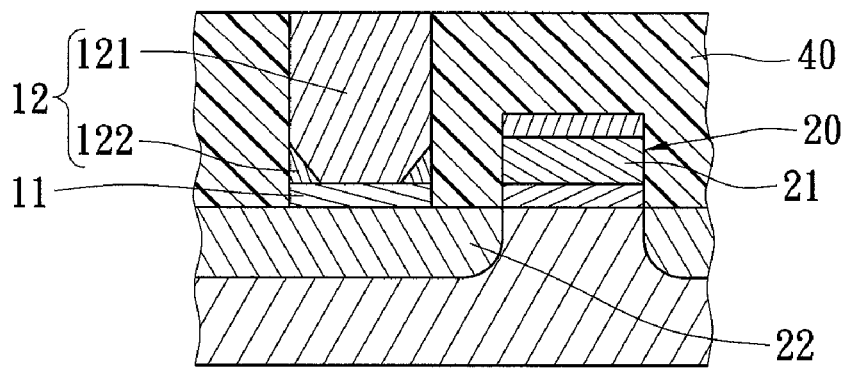

Reference is made to FIG. 4C. The P-typed poly silicon is deposited on the slave terminal 22 and the first N-typed region 122 until the thickness of the P-typed poly silicon is thicker than the thickness of the insulating material 40. Next, a chemical mechanical polish (CMP) is used for polishing the P-typed poly silicon. Thereby, the first P-typed region 121 is formed.

Figure 4D:
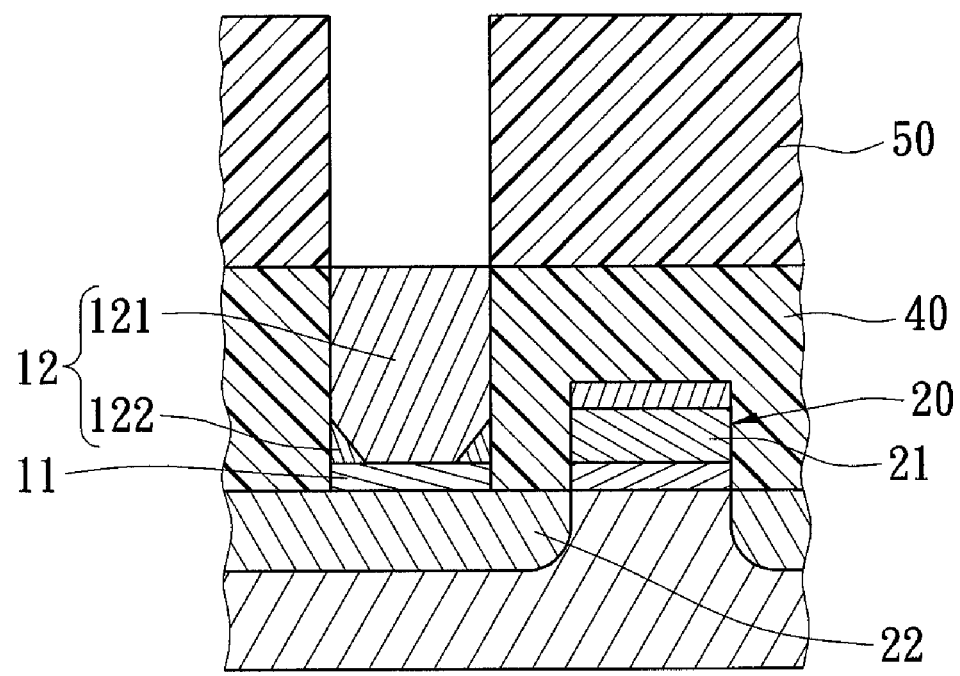

Reference is made to FIG. 4D. Another insulating material 50 is deposited on the first P-typed region 121 and the insulating material 40. The insulating material 50 is etched to form an opening so that the first P-typed region 121 is exposed.

Figure 4E:
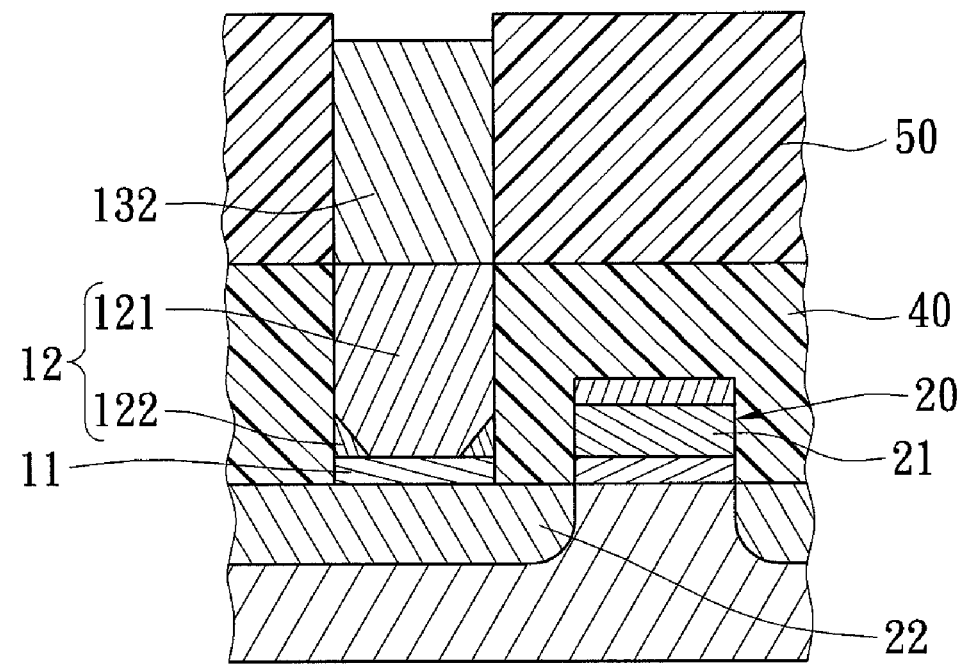

Reference is made to FIG. 4E. Next, N-typed poly silicon is deposited on the first P-typed region 121, and the upper side of the N-typed poly silicon is etched to form the second N-typed region 132.

Figure 4F:
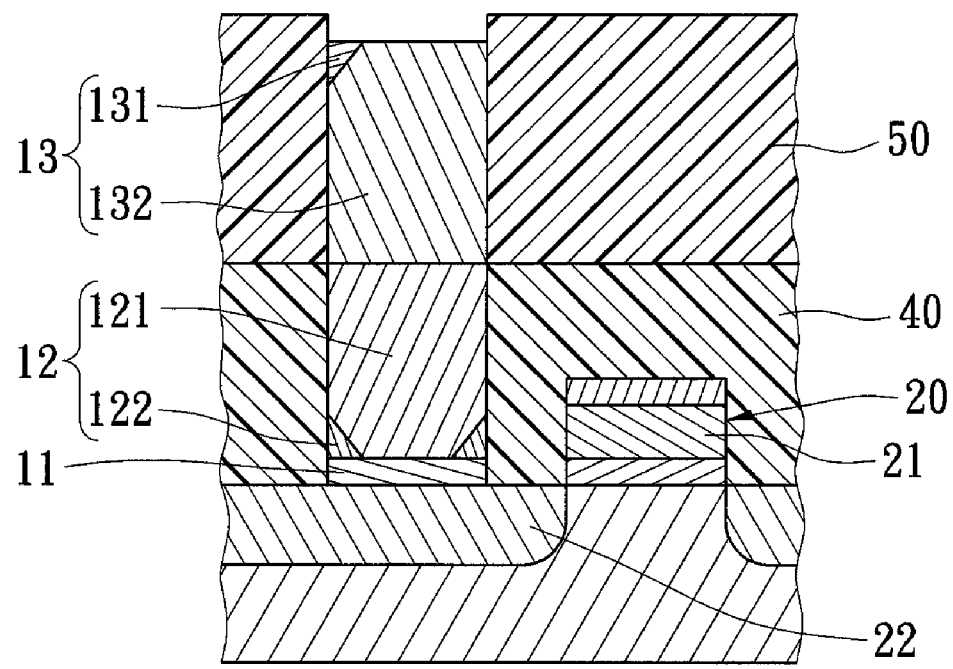
Figure 4G:
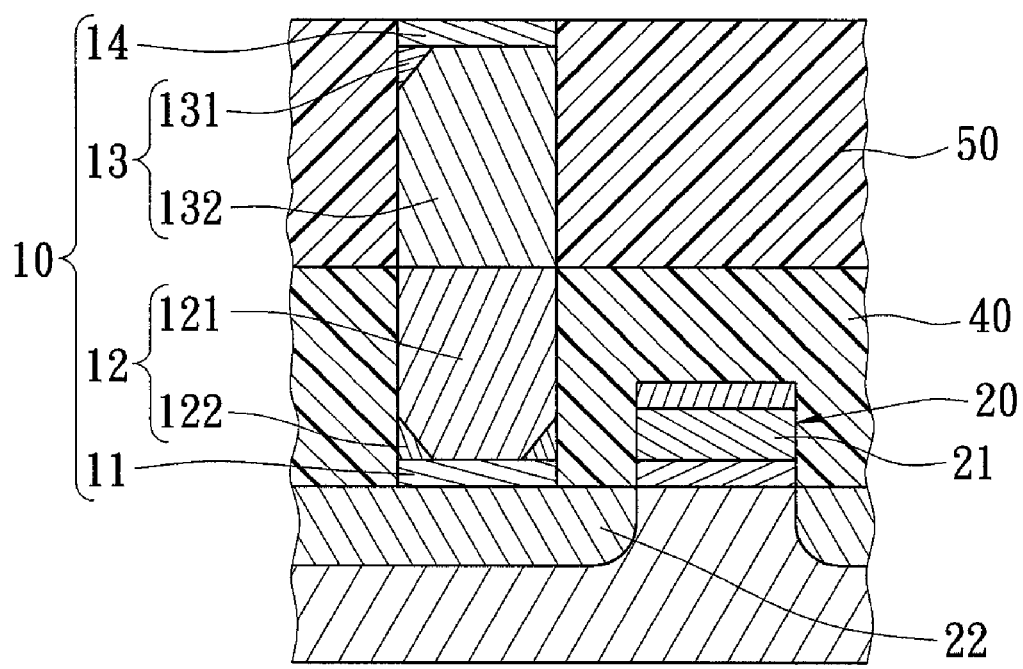

Reference is made to FIG. 4F. P-typed impurity is slantedly implanted into the second N-typed region 132 so that part of the second N-typed region 132 has a larger amount of P-typed impurity to change the characteristic of the region, thereby forming the second P-typed region 131. Reference is made to FIG. 4G. Finally, conducting metal (such as Ti) is deposited on the second P-typed region 131 and the second N-typed region 132 to form the second conducting layer 14.

After the device 10 is finished, the capacitor 30 can be manufactured. The electric pole of the capacitor 30 is connected with the upper side of the second conducting layer 14.

The manufactured method of the device 10 can be changed according to the design of the transistor 20 and the capacitor 30, and is not limited to above. When the device 10 is manufactured, the other elements of the memory cell also can be manufactured together.

Reference is made to FIG. 5, which shows the device 10 of the second embodiment of present invention. The device 10 is a diode for alternating current (DIAC). The two terminals of the device 10 are respectively connected with a slave terminal (drain) 22 of the transistor 20 and an electric pole 31 of the capacitor 30. When the capacitor is a stacked capacitor, one terminal of the device 10 is connected with a lower electric pole of the capacitor 30.

Figure 6:
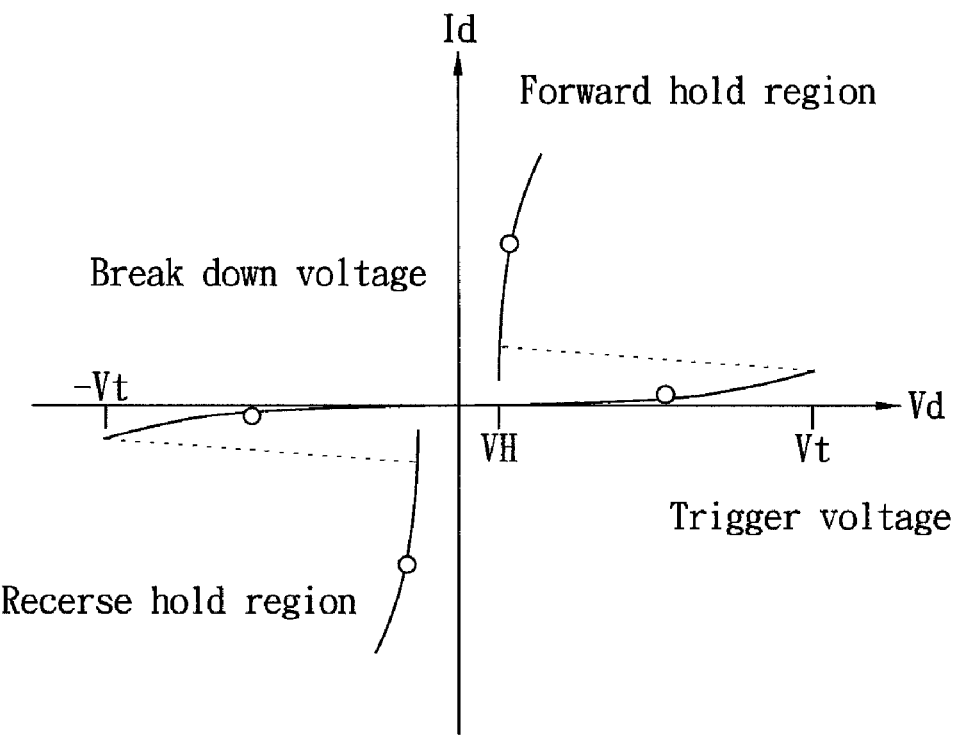
FIG. 6 is a characteristic diagram of the voltage-to-current of the second embodiment of the present invention.

Reference is made to FIG. 6. The usage way of the second embodiment of the device 10 is illustrated. FIG. 6 is a characteristic diagram of the voltage-to-current of the diode for alternating current. When the voltage of the two terminals of the diode for alternating current is negative and is larger than a negative threshold voltage Vt, electric charge can easily flow through the diode for alternating current. The electric charge moves to the positive terminal from the negative terminal of the 1 diode for alternating current. When the voltage of the two terminals of the 1 diode for alternating current is positive, and is larger than a positive threshold voltage, the electric charge also can easily flow through the diode for alternating current. The electric charge moves to the negative terminal from the positive terminal of the diode for alternating current.

When the capacitor 30 is stored with data (such as a logic status 1), the bit line BL needs a positive voltage and the absolute value of the positive voltage is larger than the absolute value of the negative threshold voltage. The word line WL also needs a positive voltage. Therefore, both the source and the gate of the transistor 20 are positive voltage. The transistor 20 is turned on, and electric charge flows into the drain from the source. Because the voltage of the two terminals of the diode for alternating current is smaller than the negative threshold voltage, electric charge can pass trough the diode for alternating current (moves to the positive terminal from the negative terminal of the diode for alternating current) and flow into the capacitor 30.

Next, the voltage of the word line WL becomes zero, and the transistor 20 is turned off. Because the voltage of the two terminals of the diode for alternating current is smaller than the positive threshold voltage, the electric charge of the capacitor 30 hardly moves from the positive terminal to the negative terminal of the diode for alternating current. It is difficult to flow into the drain of the transistor 20. This means that the electric charge of the capacitor 30 hardly leakages from the transistor 20 to improve the current-leakage problem of the capacitor 30. The logic status 1 can be kept for a longer time.

When the data is read from the capacitor 30, the bit line BL needs a negative voltage and the absolute value of the negative voltage is larger than the absolute value of the positive threshold voltage. The word line WL needs a positive voltage. Therefore, the source of the transistor 20 is negative voltage, the gate of the transistor 20 is positive voltage, and the transistor 20 is turned on. Because the voltage of the two terminals of the diode for alternating current is a positive voltage and is larger than the positive threshold voltage, the electric charge of the capacitor 30 can pass through the diode for alternating current and flow to the source. Thereby, the status of the capacitor 30 is read.

The above description is the effect of the device 10 and how to be used. Next, the structure of the device 10 is illustrated.

Figure 7:
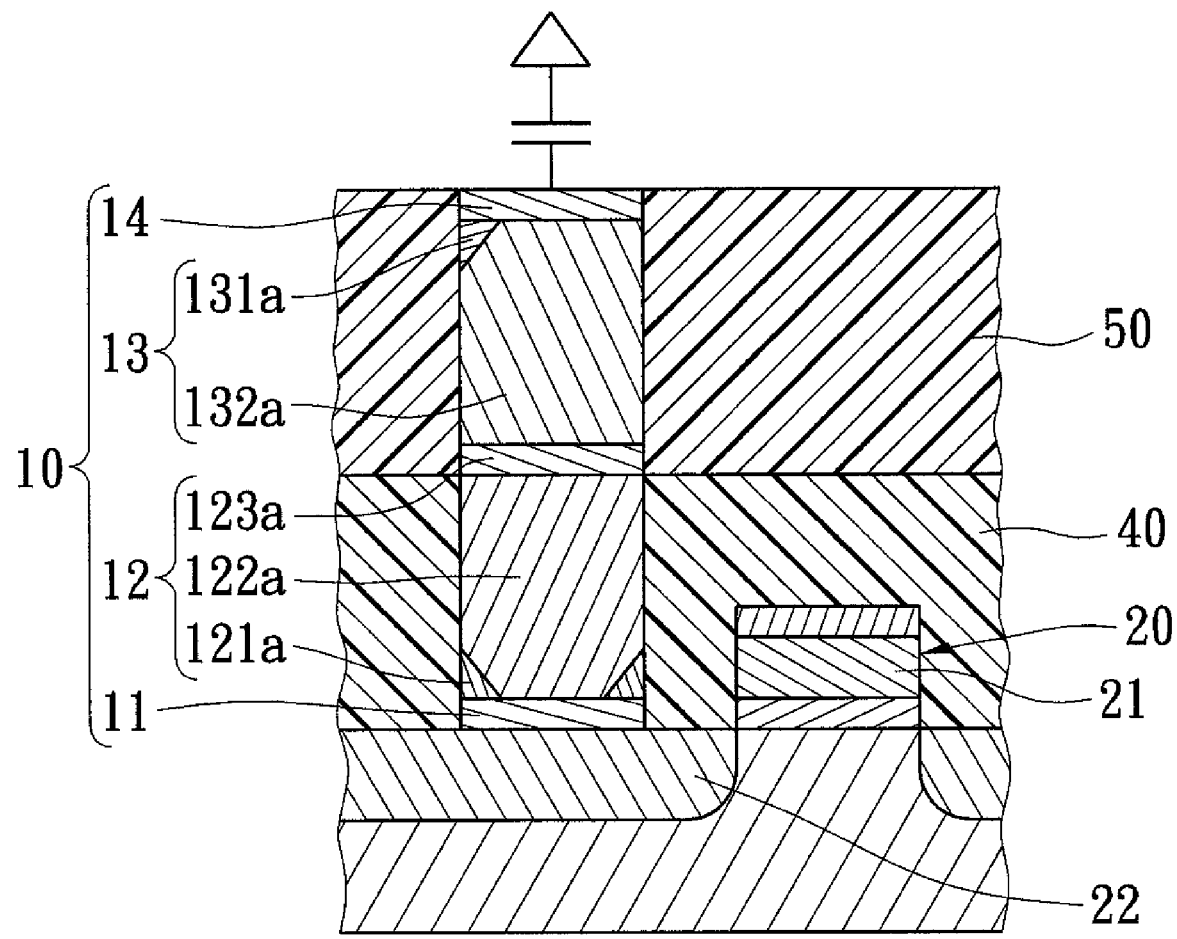
FIG. 7 is a schematic diagram of structure of the second embodiment of the present invention.

Reference is made to FIG. 7. The device 10 is stacked by a first conducting layer 11, a first structure 12, a second structure 13, and a second conducting layer 14 orderly.

The first conducting layer 11 is connected with the slave terminal 22 of the transistor 20. The first structure 12 has a first P-typed region 121a, a first N-typed region 122a, and a second P-typed region 123a. The lower side of the first P-typed region 121 and the lower side of the first N-typed region 122 contact the upper side of the first conducting layer 11, and the thickness of the first N-typed region 122a is larger than the thickness of the first P-typed region 121a. There is a gap between the second P-typed region 123a and the first P-typed region 121a. Both do not contact.

The second structure 13 has a third P-typed region 131a and a second N-typed region 132a. The lower side of the second N-typed region 132a contacts the upper side of the second P-typed region 123a. There is a gap between the third P-typed region 131a and the second P-typed region 123a. Both do not contact. The lower side of the second conducting layer 14 contacts the upper side of the third P-typed region 131a and the upper side of the second N-typed region 132a. The upper side of the second conducting layer 14 is connected with the electric pole 31 of the capacitor 30.

The manufacturing process of the device 10 of the second embodiment is similar to the first embodiment, and can be manufactured after the transistor 20 of the memory cell is finished.

First, a layer of conducting metal (such as Ti) is deposited on the slave terminal 22 to form the first conducting layer 11. Next, a layer of poly silicon is deposited. The center of the poly silicon is etched. P-typed impurity is implanted into the poly silicon to form the first P-typed region 121a. N-typed poly silicon is deposited and a chemical mechanical polish (CMP) is used for polishing the N-typed poly silicon, thereby forming the first N-typed region 122a.

Next, P-typed impurity is implanted to the upper side of the first N-typed region 122a so that the upper side of the first N-typed region 122a has a larger amount of P-typed impurity to change the characteristic of the first N-typed region 122a, thereby forming the second P-typed region 123a. Next, N-typed poly silicon is deposited. The upper side of the N-typed poly silicon is etched to form the second N-typed region 132a. P-typed impurity is slantedly implanted into the second N-typed region 132a so that part of the second N-typed region 132a has a larger amount of P-typed impurity to form the third P-typed region 131a. Finally, a layer of conducting metal (such as Ti) is deposited on the third P-typed region 131a and the second N-typed region 132a to form the second conducting layer 14.

Similarly, the manufactured process of the device 10 can be changed according to the design of the transistor 20 and the capacitor 30, and is not limited to above.

Reference is made to FIG. 8, which shows the device 10 of the third embodiment of present invention. The device 10 is a silicon controlled rectifier (SCR). The two terminals of the device 10 are respectively connected with a slave terminal (drain) 22 of the transistor 20 and an electric pole 31 of the capacitor 30. When the capacitor 30 is a stacked capacitor, one terminal of the device 10 is connected with a lower electric pole of the capacitor 30.

Figure 9:
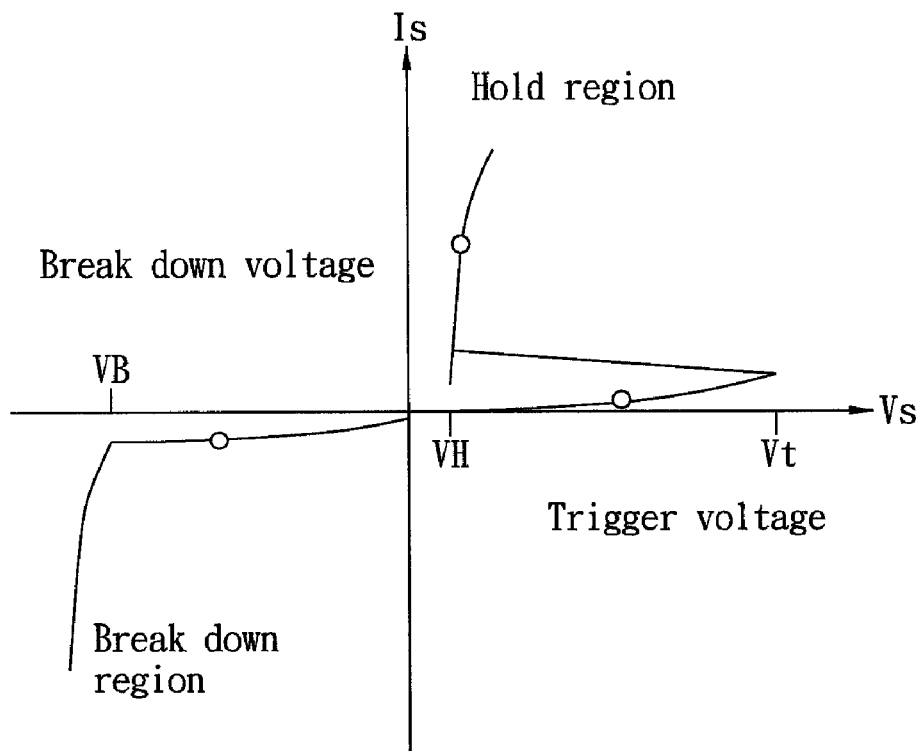
FIG. 9 is a characteristic diagram of the voltage-to-current of the third embodiment of the present invention.

Reference is made to FIG. 9. The usage way of the second embodiment of the device 10 is illustrated. FIG. 9 is a characteristic diagram of the voltage-to-current of the diode for alternating current. When the voltage of the two terminals of the silicon controlled rectifier is negative, electric charge merely passes through the silicon controlled rectifier with a small amount. When the voltage of the two terminals of the silicon controlled rectifier is positive and is larger than a positive threshold voltage, the electric charge can easily flow through the silicon controlled rectifier.

When the capacitor 30 is stored with data (such as a logic status 1), the bit line BL needs a positive voltage, and the word line WL also needs a positive voltage. Therefore, both the source and the gate of the transistor 20 are positive voltage. The transistor 20 is turned on, and electric charge flows into the drain from the source. Because the negative voltage of the two terminals of the silicon controlled rectifier is smaller than zero, electric charge can pass trough the silicon controlled rectifier with a small amount quantity and flow into the capacitor 30.

Next, the voltage of the word line WL becomes zero, and the transistor 20 is turned off. Because the voltage of the two terminals of the silicon controlled rectifier is far smaller than the threshold voltage, the electric charge of the capacitor 30 hardly passes through the silicon controlled rectifier to flow into the drain of the transistor. The electric charge hardly leakages from the transistor 20. Therefore, the current-leakage problem of the capacitor 30 is improved so that the logic status 1 can be kept for a longer time.

When the data is read from the capacitor 30, the bit line BL needs a negative voltage and the absolute value of the negative voltage is larger than the absolute value of the threshold voltage. The word line WL needs a positive voltage. Therefore, the source of the transistor 20 is negative voltage, the gate of the transistor 20 is positive voltage, and the transistor 20 is turned on. Because the voltage of the two terminals of the silicon controlled rectifier is a positive voltage and is larger than the threshold voltage, the electric charge of the capacitor 30 can pass through the silicon controlled rectifier and flow to the source. Thereby, the status of the capacitor 30 is read.

Figure 10:
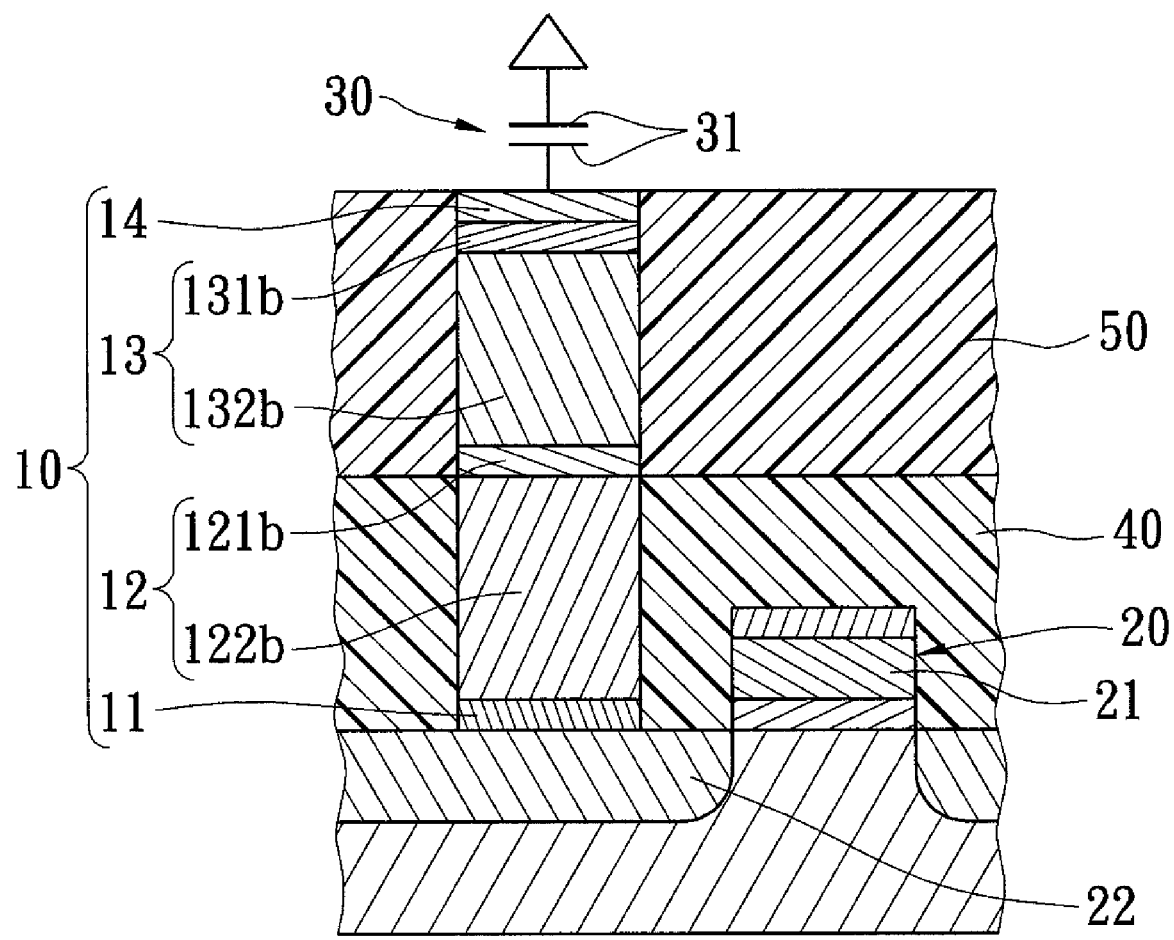
FIG. 10 is a schematic diagram of structure of the third embodiment of the present invention.

Next, the structure of the device 10 of the third embodiment is illustrated. Reference is made to FIG. 10. The device 10 is stacked by a first conducting layer 11, a first structure 12, a second structure 13, and a second conducting layer 14 orderly.

The first conducting layer 11 is connected with the slave terminal 22 of the transistor 20. The first structure 12 has a first P-typed region 121b and a first N-typed region 122b. The lower side of the first N-typed region 122b contacts the upper side of the first conducting layer 11, and the lower side of the first P-typed region 121b contacts the upper side of the first N-typed region 122b. There is a gap between the second P-typed region 121b and the first conducting layer 11. Both do not contact.

The second structure 13 has a second P-typed region 131b and a second N-typed region 132b. The lower side of the second N-typed region 132b contacts the upper side of the first P-typed region 121b. The lower side of the second P-typed region 131b contacts the upper side of the second N-typed region 132b. There is a gap between the second P-typed region 131b and the first P-typed region 121b. Both do not contact. The lower side of the second conducting layer 14 contacts the upper side of the second P-typed region 131b. The upper side of the second conducting layer 14 is connected with the electric pole 31 of the capacitor 30.

The manufacturing process of the device 10 of the third embodiment is similar to the first embodiment, and can be implemented after the transistor 20 of the memory cell is finished.

First, a layer of conducting metal (such as Ti) is deposited on the slave terminal 22 to form the first conducting layer 11. Next, a layer of N-typed poly silicon is deposited to form the first N-typed region 122b. P-typed impurity is implanted to the upper side of the first N-typed region 122b so that the upper side of the first N-typed region 122b has a larger amount of P-typed impurity to form the first P-typed region 121b. Next, a layer of N-typed poly silicon is deposited on the first P-typed region 121b to form the second N-typed region 132b. Next, P-typed impurity is implanted into the second N-typed region 132b so that part of the second N-typed region 132b has a larger amount of P-typed impurity to form the second P-typed region 131b. Finally, a layer of conducting metal (such as Ti) is deposited on the second P-typed region 131b to form the second conducting layer 14.

Similarly, the manufactured process of the device 10 can be changed according to the design of the transistor 20 and the capacitor 30, and is not limited to above.

The device for preventing current-leakage of the present invention has the following characteristics.

1. The device for preventing current-leakage has at least three kinds of embodiments. Each of the embodiments can improve the current-leakage problem and reduce the times of refreshing capacitor.

2. The structure and the manufacturing method of the device for preventing current-leakage is simple, and cam be easily applied to the manufacturing process of the memory cell.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. A device for preventing current-leakage, located between a transistor and a capacitor of a memory cell, wherein the device for preventing current-leakage is a lateral silicon controlled rectifier and two terminals of the lateral silicon controlled rectifier are respectively connected with a slave terminal of the transistor and an electric pole of the capacitor, comprising:
   a first structure having a first P-typed region and a first N-typed region, wherein the first P-typed region and the first N-typed region are connected with the slave terminal of the transistor;
   a first conducting layer connected with the slave terminal of the transistor, wherein the first structure is stacked on the first conducting layer, the first P-typed region and the first N-typed region contact the first conducting layer;
   a second structure stacked on the first structure, wherein the second structure has a second P-typed region and a second N-typed region, the second N-typed region contacts the first P-typed region, there is a gap between the second P-typed region and the first P-typed region, and the second P-typed region and the second N-typed region are connected with the electric pole of the capacitor; and
   a second conducting layer stacked on the second structure and contacting the second P-typed region and the second N-typed region, wherein the second conducting layer is connected with the electric pole of the capacitor.

2. The device for preventing current-leakage as claimed in claim 1, wherein the capacitor is a stacked capacitor.

3. The device for preventing current-leakage as claimed in claim 1, wherein the first conducting layer and the second conducting layer are made of Ti.

4. The device for preventing current-leakage as claimed in claim 1, wherein the salve terminal of the transistor is a source or a drain.

5. The device for preventing current-leakage as claimed in claim 1, wherein the first structure and the second structure are made of poly silicon.

6. A device for preventing current-leakage, located between a transistor and a capacitor of a memory cell, wherein the device for preventing current-leakage is a silicon controlled rectifier and two terminals of the silicon controlled rectifier are respectively connected with a slave terminal of the transistor and an electric pole of the capacitor, comprising:
   a first structure having a first P-typed region and a first N-typed region, wherein the first N-typed region is connected with the slave terminal of the transistor, and the first P-typed region contacts the first N-typed region;
   a first conducting layer connected with the slave terminal of the transistor, wherein the first structure is stacked on the first conducting layer, the first N-typed region contacts the first conducting layer, and there is a gap between the first P-typed region and the first conducting layer;
   a second structure stacked on the first structure, wherein the second structure has a second P-typed region and a second N-typed region, the second N-typed region contacts the first P-typed region, the second P-typed region contacts the second N-typed region, there is a gap between the second P-typed region and the first P-typed region, and the second P-typed region is connected with the electric pole of the capacitor; and
   a second conducting layer stacked on the second structure and contacting the second P-typed region, wherein the second conducting layer is connected with the electric pole of the capacitor.

7. The device for preventing current-leakage as claimed in claim 6, wherein the capacitor is a stacked capacitor.

8. The device for preventing current-leakage as claimed in claim 6, wherein the first conducting layer and the second conducting layer are made of Ti.

9. The device for preventing current-leakage as claimed in claim 6, wherein the salve terminal of the transistor is a source or a drain.

10. The device for preventing current-leakage as claimed in claim 6, wherein the first structure and the second structure are made of poly silicon.

* * * * *